United States Patent
Sobey

(10) Patent No.: US 10,650,875 B2
(45) Date of Patent: May 12, 2020

(54) SYSTEM FOR A WIDE TEMPERATURE RANGE NONVOLATILE MEMORY

(71) Applicant: SPIN MEMORY, Inc., Fremont, CA (US)

(72) Inventor: Charles H. Sobey, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/107,352

(22) Filed: Aug. 21, 2018

(65) Prior Publication Data

US 2020/0066320 A1  Feb. 27, 2020

(51) Int. Cl.
*G11C 11/16* (2006.01)
*G11C 29/52* (2006.01)
*G06F 11/10* (2006.01)

(52) U.S. Cl.
CPC ...... *G11C 11/1675* (2013.01); *G06F 11/1068* (2013.01); *G11C 11/1653* (2013.01); *G11C 11/1659* (2013.01); *G11C 11/1673* (2013.01); *G11C 29/52* (2013.01)

(58) Field of Classification Search
CPC .. G11C 11/16; G11C 11/1673; G11C 11/1675
USPC ........................................................ 365/158
See application file for complete search history.

(56) References Cited

U.S. PATENT DOCUMENTS

| | | | |
|---|---|---|---|
| 4,597,487 A | 7/1986 | Crosby et al. | |
| 5,541,868 A | 7/1996 | Prinz | |
| 5,559,952 A | 9/1996 | Fujimoto | |
| 5,629,549 A | 5/1997 | Johnson | |
| 5,640,343 A | 6/1997 | Gallagher et al. | |
| 5,654,566 A | 8/1997 | Johnson | |
| 5,691,936 A | 11/1997 | Sakakima et al. | |
| 5,695,846 A | 12/1997 | Lange et al. | |
| 5,695,864 A | 12/1997 | Slonczewski | |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 2016/0218273 A1, 06/2016, Pinarbasi (withdrawn)

(Continued)

*Primary Examiner* — Son L Mai

(57) ABSTRACT

A system for a nonvolatile memory for broad temperature range applications. The system includes a memory organized into an addressable memory range and comprising a plurality of memory arrays comprising memory cells wherein each memory array is configured for operation over a different temperature range, and a buffer for receiving a data word and an associated address for writing into the memory. A temperature sensor is used for sensing a current temperature of operation of the memory. A write controller is coupled to the buffer, the temperature sensor and the memory. The write controller is operable to perform a write operation that includes accessing a temperature value from the temperature sensor, selecting a selected memory array of the plurality of memory arrays that is configured for operation at the temperature value, and writing the data word, at the associated address, to the selected memory array.

23 Claims, 10 Drawing Sheets

(56) References Cited

U.S. PATENT DOCUMENTS

| | | |
|---|---|---|
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |

(56) References Cited

U.S. PATENT DOCUMENTS

| | | | |
|---|---|---|---|
| 7,852,662 B2 | 12/2010 | Yang | |
| 7,861,141 B2 | 12/2010 | Chen | |
| 7,881,095 B2 | 2/2011 | Lu | |
| 7,911,832 B2 | 3/2011 | Kent et al. | |
| 7,916,515 B2 | 3/2011 | Li | |
| 7,936,595 B2 | 5/2011 | Han et al. | |
| 7,936,598 B2 | 5/2011 | Zheng et al. | |
| 7,983,077 B2 | 7/2011 | Park | |
| 7,986,544 B2 | 7/2011 | Kent et al. | |
| 8,008,095 B2 | 8/2011 | Assefa et al. | |
| 8,028,119 B2 | 9/2011 | Miura | |
| 8,041,879 B2 | 10/2011 | Erez | |
| 8,055,957 B2 | 11/2011 | Kondo | |
| 8,058,925 B2 | 11/2011 | Rasmussen | |
| 8,059,460 B2 | 11/2011 | Jeong et al. | |
| 8,072,821 B2 | 12/2011 | Arai | |
| 8,077,496 B2 | 12/2011 | Choi | |
| 8,080,365 B2 | 12/2011 | Nozaki | |
| 8,088,556 B2 | 1/2012 | Nozaki | |
| 8,094,480 B2 | 1/2012 | Tonomura | |
| 8,102,701 B2 | 1/2012 | Prejbeanu et al. | |
| 8,105,948 B2 | 1/2012 | Zhong et al. | |
| 8,120,949 B2 | 2/2012 | Ranjan et al. | |
| 8,143,683 B2 | 3/2012 | Wang et al. | |
| 8,144,509 B2 | 3/2012 | Jung | |
| 8,148,970 B2 | 4/2012 | Fuse | |
| 8,159,867 B2 | 4/2012 | Cho et al. | |
| 8,201,024 B2 | 6/2012 | Burger | |
| 8,223,534 B2 | 7/2012 | Chung | |
| 8,255,742 B2 | 8/2012 | Ipek | |
| 8,278,996 B2 | 10/2012 | Miki | |
| 8,279,666 B2 | 10/2012 | Dieny et al. | |
| 8,295,073 B2 | 10/2012 | Norman | |
| 8,295,082 B2 | 10/2012 | Chua-Eoan | |
| 8,334,213 B2 | 12/2012 | Mao | |
| 8,345,474 B2 | 1/2013 | Oh | |
| 8,349,536 B2 | 1/2013 | Nozaki | |
| 8,362,580 B2 | 1/2013 | Chen et al. | |
| 8,363,465 B2 | 1/2013 | Kent et al. | |
| 8,374,050 B2 | 2/2013 | Zhou et al. | |
| 8,386,836 B2 | 2/2013 | Burger | |
| 8,415,650 B2 | 4/2013 | Greene | |
| 8,416,620 B2 | 4/2013 | Zheng et al. | |
| 8,422,286 B2 | 4/2013 | Ranjan et al. | |
| 8,422,330 B2 | 4/2013 | Hatano et al. | |
| 8,432,727 B2 | 4/2013 | Ryu | |
| 8,441,844 B2 | 5/2013 | El Baraji | |
| 8,456,883 B1 | 6/2013 | Liu | |
| 8,456,926 B2 | 6/2013 | Ong et al. | |
| 8,477,530 B2 | 7/2013 | Ranjan et al. | |
| 8,492,381 B2 | 7/2013 | Kuroiwa et al. | |
| 8,492,881 B2 | 7/2013 | Kuroiwa et al. | |
| 8,495,432 B2 | 7/2013 | Dickens | |
| 8,535,952 B2 | 9/2013 | Ranjan et al. | |
| 8,539,303 B2 | 9/2013 | Lu | |
| 8,542,524 B2 | 9/2013 | Keshtbod et al. | |
| 8,549,303 B2 | 10/2013 | Fifield et al. | |
| 8,558,334 B2 | 10/2013 | Ueki et al. | |
| 8,559,215 B2 | 10/2013 | Zhou et al. | |
| 8,574,928 B2 | 11/2013 | Satoh et al. | |
| 8,582,353 B2 | 11/2013 | Lee | |
| 8,590,139 B2 | 11/2013 | Op DeBeeck et al. | |
| 8,592,927 B2 | 11/2013 | Jan | |
| 8,593,868 B2 | 11/2013 | Park | |
| 8,609,439 B2 | 12/2013 | Prejbeanu et al. | |
| 8,617,408 B2 | 12/2013 | Balamane | |
| 8,625,339 B2 | 1/2014 | Ong | |
| 8,634,232 B2 | 1/2014 | Oh | |
| 8,667,331 B2 | 3/2014 | Hori | |
| 8,687,415 B2 | 4/2014 | Parkin et al. | |
| 8,705,279 B2 | 4/2014 | Kim | |
| 8,716,817 B2 | 5/2014 | Saida | |
| 8,716,818 B2 | 5/2014 | Yoshikawa et al. | |
| 8,722,543 B2 | 5/2014 | Belen | |
| 8,737,137 B1 | 5/2014 | Choy et al. | |
| 8,755,222 B2 | 6/2014 | Kent et al. | |
| 8,779,410 B2 | 7/2014 | Sato et al. | |
| 8,780,617 B2 | 7/2014 | Kang | |
| 8,792,269 B1 | 7/2014 | Abedifard | |
| 8,802,451 B2 | 8/2014 | Malmhall | |
| 8,810,974 B2 | 8/2014 | Noel et al. | |
| 8,817,525 B2 | 8/2014 | Ishihara | |
| 8,832,530 B2 | 9/2014 | Pangal et al. | |
| 8,852,760 B2 | 10/2014 | Wang et al. | |
| 8,853,807 B2 | 10/2014 | Son et al. | |
| 8,860,156 B2 | 10/2014 | Beach et al. | |
| 8,862,808 B2 | 10/2014 | Tsukamoto et al. | |
| 8,867,258 B2 | 10/2014 | Rao | |
| 8,883,520 B2 | 11/2014 | Satoh et al. | |
| 8,902,628 B2 | 12/2014 | Ha | |
| 8,966,345 B2 | 2/2015 | Wilkerson | |
| 8,987,849 B2 | 3/2015 | Jan | |
| 9,019,754 B1 | 4/2015 | Bedeschi | |
| 9,025,378 B2 | 5/2015 | Tokiwa | |
| 9,026,888 B2 | 5/2015 | Kwok | |
| 9,030,899 B2 | 5/2015 | Lee | |
| 9,036,407 B2 | 5/2015 | Wang et al. | |
| 9,037,312 B2 | 5/2015 | Chew | |
| 9,043,674 B2 | 5/2015 | Wu | |
| 9,070,441 B2 | 6/2015 | Otsuka et al. | |
| 9,070,855 B2 | 6/2015 | Gan et al. | |
| 9,076,530 B2 | 7/2015 | Gomez et al. | |
| 9,082,888 B2 | 7/2015 | Kent et al. | |
| 9,104,581 B2 | 8/2015 | Fee et al. | |
| 9,104,595 B2 | 8/2015 | Sah | |
| 9,130,155 B2 | 9/2015 | Chepulskyy et al. | |
| 9,136,463 B2 | 9/2015 | Li | |
| 9,140,747 B2 | 9/2015 | Kim | |
| 9,165,629 B2 | 10/2015 | Chih | |
| 9,165,787 B2 | 10/2015 | Kang | |
| 9,166,155 B2 | 10/2015 | Deshpande | |
| 9,178,958 B2 | 11/2015 | Lindamood | |
| 9,189,326 B2 | 11/2015 | Kalamatianos | |
| 9,190,471 B2 | 11/2015 | Yi et al. | |
| 9,196,332 B2 | 11/2015 | Zhang et al. | |
| 9,229,806 B2 | 1/2016 | Mekhanik et al. | |
| 9,229,853 B2 | 1/2016 | Khan | |
| 9,231,191 B2 | 1/2016 | Huang et al. | |
| 9,245,608 B2 | 1/2016 | Chen et al. | |
| 9,250,990 B2 | 2/2016 | Motwani | |
| 9,250,997 B2 | 2/2016 | Kim et al. | |
| 9,251,896 B2 | 2/2016 | Ikeda | |
| 9,257,483 B2 | 2/2016 | Ishigaki | |
| 9,263,667 B1 | 2/2016 | Pinarbasi | |
| 9,286,186 B2 | 3/2016 | Weiss | |
| 9,298,552 B2 | 3/2016 | Leem | |
| 9,299,412 B2 | 3/2016 | Naeimi | |
| 9,317,429 B2 | 4/2016 | Ramanujan | |
| 9,324,457 B2 | 4/2016 | Takizawa | |
| 9,337,412 B2 | 5/2016 | Pinarbasi et al. | |
| 9,341,939 B1 | 5/2016 | Yu et al. | |
| 9,342,403 B2 | 5/2016 | Keppel et al. | |
| 9,342,443 B2 * | 5/2016 | Walker | G06F 3/0631 |
| 9,349,482 B2 | 5/2016 | Kim et al. | |
| 9,351,899 B2 | 5/2016 | Bose et al. | |
| 9,362,486 B2 | 6/2016 | Kim et al. | |
| 9,378,817 B2 | 6/2016 | Kawai | |
| 9,379,314 B2 | 6/2016 | Park et al. | |
| 9,389,954 B2 | 7/2016 | Pelley et al. | |
| 9,390,784 B2 * | 7/2016 | Cho | G11C 7/04 |
| 9,396,065 B2 | 7/2016 | Webb et al. | |
| 9,396,991 B2 | 7/2016 | Arvin et al. | |
| 9,401,336 B2 | 7/2016 | Arvin et al. | |
| 9,406,876 B2 | 8/2016 | Pinarbasi | |
| 9,418,721 B2 | 8/2016 | Bose | |
| 9,431,084 B2 | 8/2016 | Bose et al. | |
| 9,449,720 B1 | 9/2016 | Lung | |
| 9,450,180 B1 | 9/2016 | Annunziata | |
| 9,455,013 B2 | 9/2016 | Kim | |
| 9,466,789 B2 | 10/2016 | Wang et al. | |
| 9,472,282 B2 | 10/2016 | Lee | |
| 9,472,748 B2 | 10/2016 | Kuo et al. | |
| 9,484,527 B2 | 11/2016 | Han et al. | |
| 9,488,416 B2 | 11/2016 | Fujita et al. | |

(56) References Cited

U.S. PATENT DOCUMENTS

| | | | |
|---|---|---|---|
| 9,489,146 B2* | 11/2016 | Erez | G06F 3/0653 |
| 9,490,054 B2 | 11/2016 | Jan | |
| 9,508,456 B1 | 11/2016 | Shim | |
| 9,520,128 B2 | 12/2016 | Bauer et al. | |
| 9,520,192 B2 | 12/2016 | Naeimi et al. | |
| 9,548,116 B2 | 1/2017 | Roy | |
| 9,548,445 B2 | 1/2017 | Lee et al. | |
| 9,553,102 B2 | 1/2017 | Wang | |
| 9,570,147 B2* | 2/2017 | Kim | H01L 25/0657 |
| 9,583,167 B2 | 2/2017 | Chung | |
| 9,594,683 B2 | 3/2017 | Dittrich | |
| 9,600,183 B2 | 3/2017 | Tomishima et al. | |
| 9,608,038 B2 | 3/2017 | Wang et al. | |
| 9,634,237 B2 | 4/2017 | Lee et al. | |
| 9,640,267 B2 | 5/2017 | Tani | |
| 9,646,701 B2 | 5/2017 | Lee | |
| 9,652,321 B2 | 5/2017 | Motwani | |
| 9,662,925 B2 | 5/2017 | Raksha et al. | |
| 9,697,140 B2 | 7/2017 | Kwok | |
| 9,720,616 B2 | 8/2017 | Yu | |
| 9,728,712 B2 | 8/2017 | Kardasz et al. | |
| 9,741,926 B1 | 8/2017 | Pinarbasi et al. | |
| 9,772,555 B2 | 9/2017 | Park et al. | |
| 9,773,974 B2 | 9/2017 | Pinarbasi et al. | |
| 9,780,300 B2 | 10/2017 | Zhou et al. | |
| 9,786,336 B2* | 10/2017 | Woo | G11C 7/04 |
| 9,793,319 B2 | 10/2017 | Gan et al. | |
| 9,853,006 B2 | 12/2017 | Arvin et al. | |
| 9,853,206 B2 | 12/2017 | Pinarbasi et al. | |
| 9,853,292 B2 | 12/2017 | Loveridge et al. | |
| 9,858,976 B2 | 1/2018 | Ikegami | |
| 9,859,333 B2 | 1/2018 | Kim et al. | |
| 9,865,806 B2 | 1/2018 | Choi et al. | |
| 9,935,258 B2 | 4/2018 | Chen et al. | |
| 10,008,662 B2 | 6/2018 | You | |
| 10,026,609 B2 | 7/2018 | Sreenivasan et al. | |
| 10,038,137 B2 | 7/2018 | Chuang | |
| 10,042,588 B2 | 8/2018 | Kang | |
| 10,043,851 B1 | 8/2018 | Shen | |
| 10,043,967 B2 | 8/2018 | Chen | |
| 10,062,837 B2 | 8/2018 | Kim et al. | |
| 10,115,437 B1* | 10/2018 | Yuan | G11C 5/005 |
| 10,115,446 B1 | 10/2018 | Louie et al. | |
| 10,134,988 B2 | 11/2018 | Fennimore et al. | |
| 10,163,479 B2 | 12/2018 | Berger et al. | |
| 10,186,614 B2 | 1/2019 | Asami | |
| 10,339,983 B1* | 7/2019 | Confalonieri | G11C 7/04 |
| 2002/0090533 A1 | 7/2002 | Zhang et al. | |
| 2002/0105823 A1 | 8/2002 | Redon et al. | |
| 2003/0085186 A1 | 5/2003 | Fujioka | |
| 2003/0117840 A1 | 6/2003 | Sharma et al. | |
| 2003/0151944 A1 | 8/2003 | Saito | |
| 2003/0197984 A1 | 10/2003 | Inomata et al. | |
| 2003/0218903 A1 | 11/2003 | Luo | |
| 2004/0012994 A1 | 1/2004 | Slaughter et al. | |
| 2004/0026369 A1 | 2/2004 | Ying | |
| 2004/0061154 A1 | 4/2004 | Huai et al. | |
| 2004/0094785 A1 | 5/2004 | Zhu et al. | |
| 2004/0130936 A1 | 7/2004 | Nguyen et al. | |
| 2004/0173315 A1 | 9/2004 | Leung | |
| 2004/0257717 A1 | 12/2004 | Sharma et al. | |
| 2005/0041342 A1 | 2/2005 | Huai et al. | |
| 2005/0051820 A1 | 3/2005 | Stojakovic et al. | |
| 2005/0063222 A1 | 3/2005 | Huai et al. | |
| 2005/0104101 A1 | 5/2005 | Sun et al. | |
| 2005/0128842 A1 | 6/2005 | Wei | |
| 2005/0136600 A1 | 6/2005 | Huai | |
| 2005/0158881 A1 | 7/2005 | Sharma | |
| 2005/0180202 A1 | 8/2005 | Huai et al. | |
| 2005/0184839 A1 | 8/2005 | Nguyen et al. | |
| 2005/0201023 A1 | 9/2005 | Huai et al. | |
| 2005/0237787 A1 | 10/2005 | Huai et al. | |
| 2005/0280058 A1 | 12/2005 | Pakala et al. | |
| 2006/0018057 A1 | 1/2006 | Huai | |
| 2006/0049472 A1 | 3/2006 | Diao et al. | |
| 2006/0077734 A1 | 4/2006 | Fong | |
| 2006/0087880 A1 | 4/2006 | Mancoff et al. | |
| 2006/0092696 A1 | 5/2006 | Bessho | |
| 2006/0132990 A1 | 6/2006 | Morise et al. | |
| 2006/0227465 A1 | 10/2006 | Inokuchi et al. | |
| 2007/0019337 A1 | 1/2007 | Apalkov et al. | |
| 2007/0096229 A1 | 5/2007 | Yoshikawa | |
| 2007/0242501 A1 | 10/2007 | Hung et al. | |
| 2008/0049488 A1 | 2/2008 | Rizzo | |
| 2008/0079530 A1 | 4/2008 | Weidman et al. | |
| 2008/0112094 A1 | 5/2008 | Kent et al. | |
| 2008/0151614 A1 | 6/2008 | Guo | |
| 2008/0259508 A2 | 10/2008 | Kent et al. | |
| 2008/0297292 A1 | 12/2008 | Viala et al. | |
| 2009/0046501 A1 | 2/2009 | Ranjan et al. | |
| 2009/0072185 A1 | 3/2009 | Raksha et al. | |
| 2009/0091037 A1 | 4/2009 | Assefa et al. | |
| 2009/0098413 A1 | 4/2009 | Kanegae | |
| 2009/0146231 A1 | 6/2009 | Kuper et al. | |
| 2009/0161421 A1 | 6/2009 | Cho et al. | |
| 2009/0209102 A1 | 8/2009 | Zhong et al. | |
| 2009/0231909 A1 | 9/2009 | Dieny et al. | |
| 2010/0124091 A1 | 5/2010 | Cowbum | |
| 2010/0162065 A1 | 6/2010 | Norman | |
| 2010/0193891 A1 | 8/2010 | Wang et al. | |
| 2010/0246254 A1 | 9/2010 | Prejbeanu et al. | |
| 2010/0271870 A1 | 10/2010 | Zheng et al. | |
| 2010/0290275 A1 | 11/2010 | Park et al. | |
| 2011/0032645 A1 | 2/2011 | Noel et al. | |
| 2011/0058412 A1 | 3/2011 | Zheng et al. | |
| 2011/0061786 A1 | 3/2011 | Mason | |
| 2011/0089511 A1 | 4/2011 | Keshtbod et al. | |
| 2011/0133298 A1 | 6/2011 | Chen et al. | |
| 2012/0052258 A1 | 3/2012 | Op DeBeeck et al. | |
| 2012/0069649 A1 | 3/2012 | Ranjan et al. | |
| 2012/0155156 A1 | 6/2012 | Watts | |
| 2012/0155158 A1 | 6/2012 | Higo | |
| 2012/0280336 A1 | 6/2012 | Watts | |
| 2012/0181642 A1 | 7/2012 | Prejbeanu et al. | |
| 2012/0188818 A1 | 7/2012 | Ranjan et al. | |
| 2012/0280339 A1 | 11/2012 | Zhang et al. | |
| 2012/0294078 A1 | 11/2012 | Kent et al. | |
| 2012/0299133 A1 | 11/2012 | Son et al. | |
| 2013/0001506 A1 | 1/2013 | Sato et al. | |
| 2013/0001652 A1 | 1/2013 | Yoshikawa et al. | |
| 2013/0021841 A1 | 1/2013 | Zhou et al. | |
| 2013/0244344 A1 | 9/2013 | Malmhall et al. | |
| 2013/0267042 A1 | 10/2013 | Satoh et al. | |
| 2013/0270661 A1 | 10/2013 | Yi et al. | |
| 2013/0307097 A1 | 11/2013 | Yi et al. | |
| 2013/0341801 A1 | 12/2013 | Satoh et al. | |
| 2014/0009994 A1 | 1/2014 | Parkin et al. | |
| 2014/0042571 A1 | 2/2014 | Gan et al. | |
| 2014/0070341 A1 | 3/2014 | Beach et al. | |
| 2014/0103472 A1 | 4/2014 | Kent et al. | |
| 2014/0136870 A1 | 5/2014 | Breternitz et al. | |
| 2014/0151837 A1 | 6/2014 | Ryu | |
| 2014/0169085 A1 | 6/2014 | Wang et al. | |
| 2014/0177316 A1 | 6/2014 | Otsuka et al. | |
| 2014/0217531 A1 | 8/2014 | Jan | |
| 2014/0252439 A1 | 9/2014 | Guo | |
| 2014/0264671 A1 | 9/2014 | Chepulskyy et al. | |
| 2014/0281284 A1 | 9/2014 | Block et al. | |
| 2015/0056368 A1 | 2/2015 | Wang et al. | |
| 2015/0279904 A1 | 10/2015 | Pinarbasi et al. | |
| 2015/0301932 A1* | 10/2015 | Oh | G06F 11/00 |
| | | | 711/102 |
| 2016/0087193 A1 | 3/2016 | Pinarbasi et al. | |
| 2016/0163973 A1 | 6/2016 | Pinarbasi | |
| 2016/0218278 A1 | 7/2016 | Pinarbasi et al. | |
| 2016/0283385 A1 | 9/2016 | Boyd et al. | |
| 2016/0315118 A1 | 10/2016 | Kardasz et al. | |
| 2016/0378592 A1 | 12/2016 | Ikegami et al. | |
| 2017/0062712 A1 | 3/2017 | Choi et al. | |
| 2017/0123991 A1 | 5/2017 | Sela et al. | |
| 2017/0133104 A1 | 5/2017 | Darbari et al. | |
| 2017/0199459 A1 | 7/2017 | Ryu et al. | |
| 2018/0033957 A1 | 2/2018 | Zhang | |
| 2018/0097006 A1 | 4/2018 | Kim et al. | |

(56) References Cited

U.S. PATENT DOCUMENTS

| | | |
|---|---|---|
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| FR | 2910716 | 6/2008 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB-MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

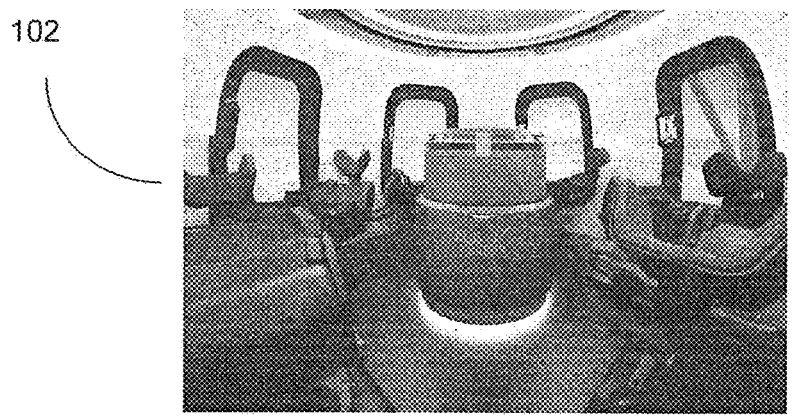
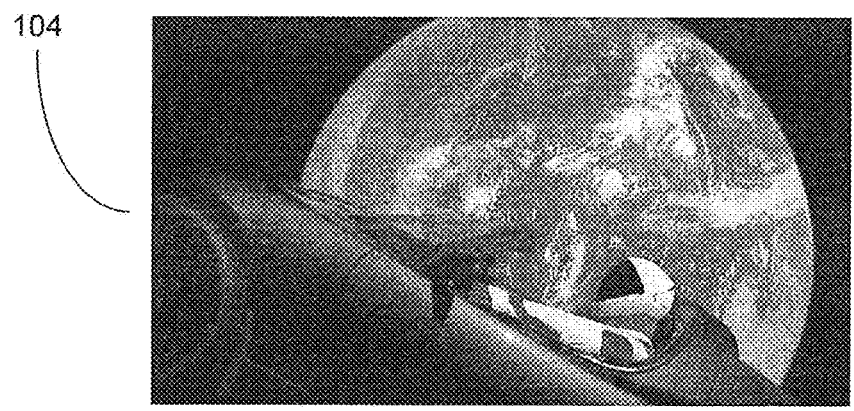
FIG. 1

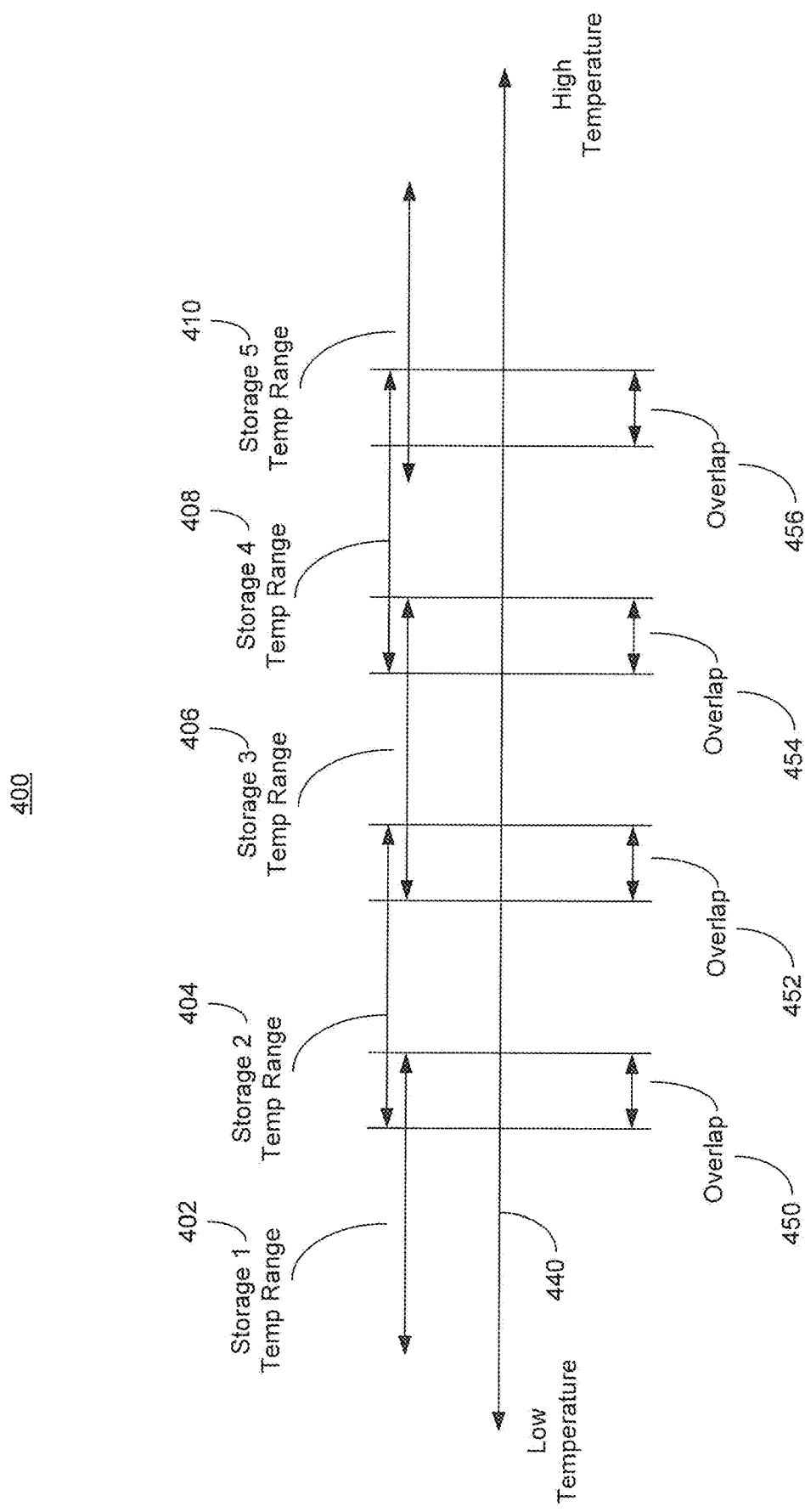

SYSTEM FOR A WIDE TEMPERATURE RANGE NONVOLATILE MEMORY

FIELD OF THE INVENTION

Embodiments of the present invention are generally related to integrated circuit structures used in memory systems that can be used by computer systems, including embedded computer systems.

BACKGROUND OF THE INVENTION

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction (MTJ).

MRAM devices can store information by changing the orientation of the magnetization of the free layer of the MTJ. In particular, based on whether the free layer is in a parallel or anti-parallel alignment relative to the reference layer, either a one or a zero can be stored in each MRAM cell. Due to the spin-polarized electron tunneling effect, the electrical resistance of the cell changes due to the orientation of the magnetic fields of the two layers. The electrical resistance is typically referred to as tunnel magnetoresistance (TMR) which is a magnetoresistive effect that occurs in a MTJ. The cell's resistance will be different for the parallel and anti-parallel states and thus the cell's resistance can be used to distinguish between a one and a zero. One important feature of MRAM devices is that they are non-volatile memory devices, since they maintain the information even when the power is off.

MRAM devices are considered as the next generation structures for a wide range of memory applications. MRAM products based on spin transfer torque transfer switching are already making its way into large data storage devices. Spin transfer torque magnetic random access memory (STT-MRAM), or spin transfer switching, uses spin-aligned (polarized) electrons to change the magnetization orientation of the free layer in the magnetic tunnel junction. In general, electrons possess a spin, a quantized number of angular momentum intrinsic to the electron. An electrical current is generally unpolarized, e.g., it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a one or a zero based on whether the free layer is in the parallel or anti-parallel states relative to the reference layer.

The fabrication of MRAM involves the formation of small MTJ (Magnetic Tunnel Junction) patterns in pillar shapes. The pillars or pillar structures can be patterned on a hard mask layer and then transferred to MTJ films. The patterning of pillars on a hard mask layer is traditionally done using an electron beam lithography in a research environment. However, for high volume production, electron beam patterning is not cost effective as the process is very slow. Alternately, these pillars can be patterned using optical lithography tools. Optical lithography resolution is limited by diffraction. Since the pillars, when printed onto a layer of photoresist, are two dimensional features, it is more challenging to achieve the same resolution as the resolution can be achieved by a-1D pattern such as a line.

Importantly, it is known that by altering the semiconductor fabrication process for MTJ MRAM cells, the optimum temperature range over which the cells operate can be adjusted. Depending upon the particular fabrication process, memory cells can be fabricated with a different A to operate at different temperatures (e.g., low temperature, medium temperature, high temperature, etc.).

The nonvolatile aspect of MRAM makes its use in certain applications extremely valuable. For example, automotive, aerospace, and military uses require broad temperature range operability, and space tourism, heavy manufacturing in space, colonization and mining of moons, asteroids, and planets are all under serious research and development by many companies around the world. Reliable data and reliable datacenters will likely be necessary for both manned and unmanned applications. With the distances involved, terrestrial data centers may respond too slowly for mission-critical information or for satisfying entertainment. It would be very advantageous to bring MRAM storage devices along with the vehicle, platform, or the like. This would essentially eliminate the latency due to the need to communicate with terrestrial data centers.

Computing and storage devices must be kept within temperature limits of their internal circuits to optimize performance. However, heat shields, cooling, or heating all add mass to the mission. Added mass equates to greatly increased launch costs. Temperatures can vary widely depending upon the usage of the storage device. This is particularly true in space applications, where there are enormous temperature differences between, for example, shaded areas of a vehicle and sunlit areas of the vehicle.

Thus what is needed is a temperature robust data storage system that does not add excessive mass to the vehicle. What is needed is a reliable memory system that can function reliably across a broad temperature range.

SUMMARY OF THE INVENTION

Embodiments of the present invention implement a system for a temperature robust nonvolatile memory for broad temperature range applications. Embodiments of the present invention implement a temperature robust MRAM data storage system that does not add excessive mass to the memory system. Embodiments of the present invention provide a reliable MRAM system that can function reliably across a broad temperature range, and is useful for automotive, aeronautics, military, space exploration, and other such systems that require operation across a broad temperature range.

In one embodiment, the present invention is implemented as a system for a temperature robust nonvolatile memory for broad temperature range applications. The system includes a memory organized into an addressable memory range and comprising a plurality of memory arrays comprising memory cells wherein each memory array is configured for operation over a different temperature range, and a buffer for receiving data words and associated addresses for writing into the memory. A temperature sensor is used for sensing a current temperature of operation of the memory. A write controller is coupled to the buffer, the temperature sensor and the memory, the write controller is operable to perform write operations that include accessing temperature values from the temperature sensor, selecting a selected memory array of the plurality of memory arrays that is configured for operation at a current temperature value, and writing the data words, at the associated addresses, to the selected memory array.

In this manner, the system includes a plurality of MRAM memory arrays. Each of the memory arrays is tuned to be optimized at a different temperature range (e.g., low temperature, medium temperature, high temperature, etc.). The system further includes a temperature sensor coupled to the controller, which allows targeted read/write access to a particular one of the memory arrays based on a current temperature reading. Importantly, the system does not need to be insulated to reduce temperature variations which would typically occur in space applications and in some mobile applications.

Accordingly, an advantage of the present invention is to reduce the amount of environmental control (HVAC) and insulation that needs to be moved around (e.g. launched on the space vehicle) as opposed to being specifically disposed around the system. This is due to the fact that the system is designed to reliably operate across a broad range of temperatures. The solution of the present invention, as described above, is to use a plurality of temperature optimized MRAM memory arrays. Each of the memory arrays is tuned to be optimized at a different temperature range (e.g., low temperature, medium temperature, high temperature, etc.). Different examples as to what could cause temperatures to change would be, for example, if the system is on a space vehicle and something blocks out the sun (e.g., a solar panel, etc.), or if the space vehicle is in the shade (e.g., on the nighttime side of Earth) and it passes into sunlight. Another example would be a vehicle housed in a garage, and that same vehicle later parked during the daytime in the desert (e.g. Phoenix). Other examples include military, aeronautic, automotive and any other application that requires operation across a broad temperature range.

In one embodiment, the memory cells of the plurality of memory arrays comprise magnetic memory cells.

In one embodiment, the magnetic memory cells comprise Magnetic Tunnel Junction type magnetic memory cells.

In one embodiment, a memory table is associated with the memory, wherein the memory table is operable to store an address map for indicating which memory array of the plurality of memory arrays comprises a data word associated with a given address within the addressable memory range.

In one embodiment, the present invention is implemented as a read controller coupled to the buffer, the temperature sensor and the memory, the read controller operable to perform a read operation. The read operation includes accessing a read address from the buffer wherein the read address is associated with the read operation, reading contents of the memory table associated with the read address to determine a particular memory array of the plurality of memory arrays containing data associated with the read address, and reading the particular memory array, at the read address, to obtain a data word associated with the read address.

In one embodiment, the plurality of memory arrays includes a first memory array comprising a plurality of first memory cells that are fabricated to operate over a first temperature range, a second memory array comprising a plurality of second memory cells that are fabricated to operate over a second temperature range, wherein the second temperature range is higher than the first temperature range, and a third memory array comprising a plurality of third memory cells that are fabricated to operate over a third temperature range, wherein the third temperature range is higher than the second temperature range and wherein the second temperature range is higher than the first temperature range and wherein further a high temperature of the first temperature range and a low temperature of the second temperature range overlap and wherein further a high temperature of the second temperature range and a low temperature of the third temperature range overlap.

In one embodiment, a management controller is coupled to the memory and the temperature sensor, the management controller for performing a copy-over procedure. The procedure includes reading a current temperature value from the temperature sensor, based on the current temperature value, determining that the memory has undergone a transition from operating within a first temperature range to operating within a second temperature range, selecting a first memory array associated with the first temperature range and selecting a second memory array associated with the second temperature range, and copying data from the first memory array over to the second memory array responsive to the transition.

In one embodiment, a management controller is coupled to the memory and the temperature sensor, the management controller for performing a copy-over procedure. The procedure includes reading a current temperature value from the temperature sensor, based on the current temperature value, determining that the memory has undergone a transition from operating within a first temperature range to operating within a second temperature range, selecting a first memory array associated with the first temperature range and selecting a second memory array associated with the second temperature range. The procedure further includes copying data from the first memory array over to the second memory array responsive to the transition, and updating the address map of the memory table to indicate that the data copied from the copying is addressable using the second memory array.

In one embodiment, the present invention is implemented as method of writing data to a memory system, the method including receiving a data word and an associated address for writing into the memory system, wherein the memory system is organized into an addressable memory range and comprises a plurality of memory arrays comprising memory cells wherein each memory array of the plurality of memory arrays is configured for operation over a different temperature range, accessing a current temperature value from a temperature sensor, selecting a selected memory array of the plurality of memory arrays that is configured for operation at the current temperature value, and writing the data word, at the associated address, to the selected memory array.

In one embodiment, the present invention is implemented as a method of storing data in a memory system. The method includes maintaining an address map of data stored in a memory system, wherein the memory system is organized into an addressable memory range and comprising a plurality of memory arrays comprising memory cells wherein each memory array of the plurality of memory arrays is configured for operation over a different temperature range and wherein further the memory system is configured to operate over a plurality of temperature ranges. The address map indicates which memory array of the plurality of memory arrays comprises a data word associated with a given address. The method further includes reading a current temperature value from a temperature sensor, based on the current temperature value, determining that the memory system has undergone a transition from operating within a first temperature range of the plurality of temperature ranges to operating within a second temperature range of the plurality of temperature ranges, selecting a first memory array associated with the first temperature range and selecting a second memory array associated with the second temperature range, copying data from the first memory array over to the second memory array responsive to the transition, and updating the memory map based on the copying.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

FIG. 1 shows two exemplary applications of a memory array system in accordance with one embodiment of the present invention.

FIG. 4 shows a diagram showing a temperature range of operation for a plurality of memory arrays in accordance with one embodiment of the present invention.

DETAILED DESCRIPTION

Figure 2:
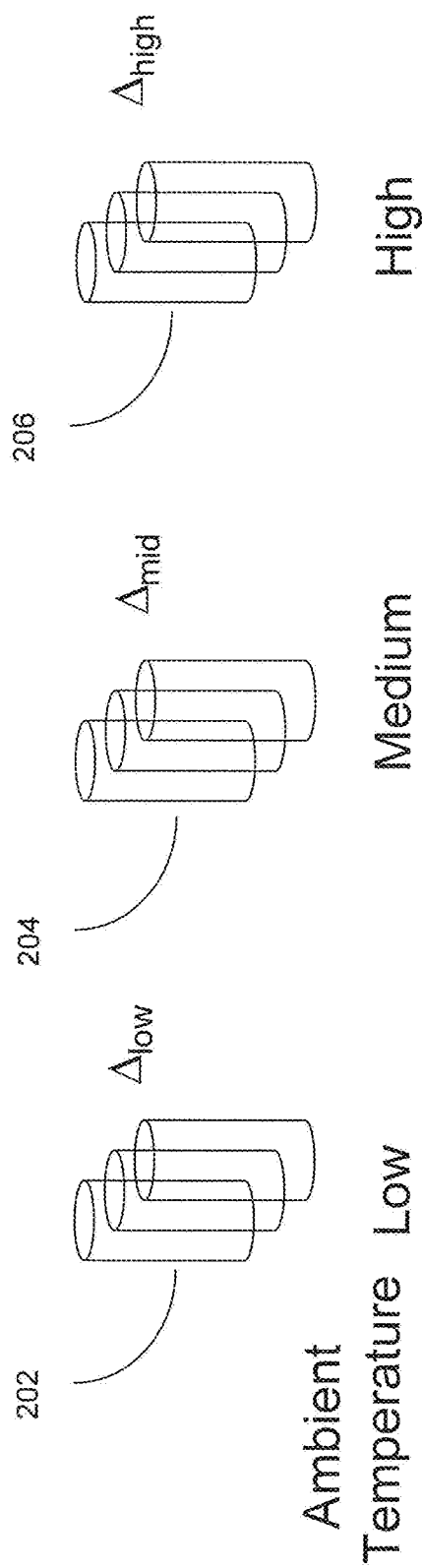
FIG. 2 shows a memory organized into an addressable memory range and comprising a plurality of discrete memory arrays comprising memory cells wherein each memory array is configured for operation over a different temperature range in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

A System for a Wide Temperature Range Nonvolatile Memory

Embodiments of the present invention implement a system for a temperature robust nonvolatile memory for broad temperature range applications. Embodiments of the present invention implement a temperature robust MRAM data storage system that does not add excessive mass to the memory system. Embodiments of the present invention provide a reliable MRAM system that can function reliably across a broad temperature range, and is useful for automotive, aeronautics, military, space exploration, and other such systems that require operation across a broad temperature range. Other such systems can include extreme temperatures encountered in drilling or in geological sensing applications.

In one embodiment, the present invention is implemented as a system for a temperature robust nonvolatile memory. The system includes a memory organized into an addressable memory range and comprising a plurality of memory arrays comprising memory cells wherein each memory array is configured for operation over a different temperature range, and a buffer for receiving a data word and an associated address for writing into the memory. A temperature sensor is used for sensing a current temperature of operation of the memory. A write controller is coupled to the buffer, the temperature sensor and the memory, the write controller operable to perform a write operation that includes accessing a temperature value from the temperature sensor, selecting a selected memory array of the plurality of memory arrays that is configured for operation at the temperature value, and writing the data word, at the associated address, to the selected memory array.

In this manner, the system includes a plurality of MRAM memory arrays. Each of the memory arrays is tuned to be optimized at a different temperature (e.g., low temperature, medium temperature, high temperature, etc.). The system further includes a temperature sensor coupled to the controller, which allows targeted read write access to a particular one of the memory arrays based on a current temperature reading. Importantly, the system does not need to be insulated to reduce temperature variations which would typically occur in space applications and some mobile applications, for example.

FIG. 1 shows two exemplary applications of a memory array system in accordance with one embodiment of the present invention. FIG. 1 shows an image 102 depicting the interior of a space vehicle for taking humans into space (e.g., space tourism, etc.) and an image 104 depicting a human a vehicle in outer space (e.g., space tourism, recreation, etc.). Of course, these are merely exemplary uses.

Accordingly, one advantage of the present invention is to reduce the amount of environmental control (HVAC) and insulation that needs to be moved around (e.g. launched on the space vehicle). This is due to the fact that the system is designed to reliably operate across a broad range of temperatures. The solution of the present invention, as described above, is to use a plurality of temperature optimized MRAM memory arrays. Each of the memory arrays is tuned to be optimized at a different temperature (e.g., low temperature, medium temperature, high temperature, etc.). Different examples as to what could cause temperatures to change would be, for example, if the system is on a space vehicle and something blocks out the sun (e.g., a solar panel, etc.), or if the space vehicle is in the shade (e.g., on the nighttime side of Earth) and it passes into sunlight. Another example would be a vehicle housed in a garage, and that same vehicle later parked during the daytime in the desert (e.g. Phoenix).

FIG. 2 shows a memory organized into an addressable memory range and comprising a plurality of memory arrays comprising memory cells wherein each memory array is configured for operation over a different temperature range in accordance with one embodiment of the present invention. In the FIG. 2 embodiment, three memory arrays 202-206 are shown. Memory array 202 is fabricated using semiconductor processes that are optimized for low temperatures. This means that reading and writing occurs most efficiently at low temperature. Memory array 204 is similarly fabricated such that it is optimized for medium temperatures. Memory array 206 is fabricated such that it is optimized for high temperatures (e.g., most efficient operation at high temperature). Thus, each memory array 202-206 is configured for operation over a different temperature range. When all three arrays 202-206 are integrated into a single memory, its operability is across the low to high temperature ranges.

Figure 3:
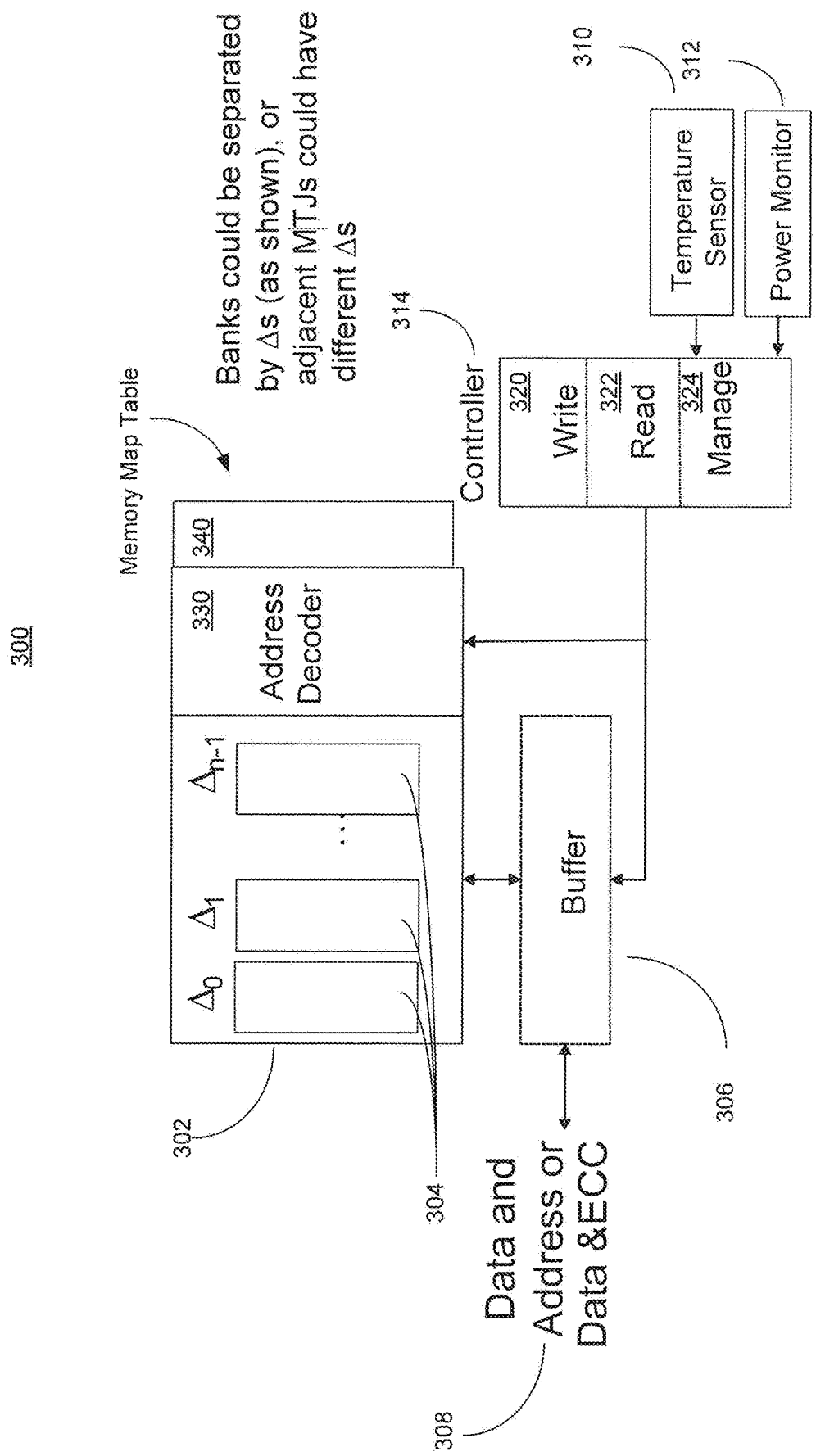
FIG. 3 depicts a system for a temperature robust nonvolatile memory for broad temperature range applications in accordance with one embodiment of the present invention.

FIG. 3 depicts a system 300 for a temperature robust nonvolatile memory broad temperature range applications in accordance with one embodiment of the present invention. The system 300 includes a memory 302 organized into an addressable memory range and comprising a plurality of memory arrays 304 comprising memory cells. In one embodiment, each of the memory arrays 304 are configured for operation over a different temperature range, $\Delta_0 \Delta_1, \ldots \Delta_{(n-1)}$.

A buffer 306 is shown for receiving data and addresses from an input output port 308. Such data typically comprises data words and associated addresses and commands for writing into the memory 302. A temperature sensor 310 is used for sensing a current temperature of operation of the memory 300. A controller 314 is coupled to the buffer 302, the temperature sensor 310 and the memory 302.

In one embodiment, the controller 314 is operable to perform read and write operations that includes accessing a temperature value from the temperature sensor 310, selecting a selected memory array of the plurality of memory arrays 304 that is configured for operation at the temperature value, and writing the data word, at the associated address, to the selected one of the memory arrays 304.

It is appreciated that when the data or ECC (error correction coding) encoded data and parity come into the buffer 306, what also comes is the address to which the data is to be written and commands for the controller (e.g. write data, read data, synchronize, etc.). In the FIG. 3 embodiment, the data addresses and commands come in from the left through the port 308 to the buffer 306 and then on to controller 314, where the controller has to decide based upon the commands what to do with the data. A typical command would be for example, to read or write data, and the controller has to decide what memory array with which to do the reading or the writing based on the currently reported temperature.

In one embodiment, the memory cells of the plurality of memory arrays comprise magnetic memory cells. In one embodiment, the magnetic memory cells comprise Magnetic Tunnel Junction type magnetic memory cells. Magnetic tunnel junction memory cells are popular for use in storage systems since they are nonvolatile.

In one embodiment, a memory table 340 is associated with the memory 302. The memory table 340 is operable to store one or more address maps for indicating which memory array of the plurality of memory arrays 304 comprises a data word associated with a given address within the addressable memory range.

It should be noted that in one embodiment, memory table 340 would be straightforward since it would only point to one of the memory arrays based upon the current temperature. If the system 300 has experienced a stable temperature over a long period, the system is only using one memory array. The memory table indicates which memory array the system needs to copy over to (e.g., synchronize) when the temperature is changing. It should be noted that in other embodiments the memory table 340 could be much more complicated if the data is distributed all across the memory arrays. The level of complexity of the memory table 340 thus varies with multiple use case scenarios.

In one embodiment, the system 300 of the present invention includes a read controller 322 coupled to the buffer, the temperature sensor 310 and the memory 302. The read controller 322 is operable to perform read operations for system 300. The read operations include accessing a read address from the buffer 306. The read address is associated with the read operation, reading contents of the memory table 340 associated with the read address to determine a particular memory array of the plurality of memory arrays 304 containing data associated with the read address, and reading the particular memory array, at the read address, to obtain a data word associated with the read address.

In one embodiment, the system 300 of the present invention includes a write controller 320 coupled to the buffer 306. The write controller 320 is also coupled to the temperature sensor 310 and the memory 302. The write controller 320 is operable to perform write operations. The write operations include accessing a write address from the buffer 306. The write address is associated with the write operation, reading contents of the memory table 340 associated with the write address to determine a particular memory array of the plurality of memory arrays 304 to write the data word, and to write the particular memory array, at the write address, the data word associated with the write address.

In one embodiment, the controller 314 includes a management controller 324. The management controller 324 is the part of the controller 314 operable for managing operations of the controller 314 that includes accessing a temperature value from the temperature sensor 310, selecting a selected memory array of the plurality of memory arrays 304 that is configured for operation at the temperature value, and commanding the reading and writing of data words, at the associated addresses, to the selected ones of the memory arrays 304.

In one embodiment, the power monitor 312 functions by maintaining local power (e.g., such as a capacitor) so that if a write is in progress, the capacitor can provide enough backup power to ensure the write is completed. For example, in one embodiment, if externally provided power begins to drop, the power monitor 312 can take steps to preserve data within a few milliseconds. One example is where the power monitor indicates that data needs to be flushed from volatile memory to nonvolatile memory. The power monitor 312 provides a source of local power to ensure synchronizations are not corrupted.

FIG. 4 shows a diagram 400 showing a plurality of operating temperature ranges of operation for a plurality of memory arrays in accordance with one embodiment of the present invention. As shown in FIG. 4, five exemplary memory arrays 402-410 are shown. The five memory arrays 402-410 are optimized to function along the broad temperature range 440, with memory array 402 optimized for the lowest temperature range, memory array 404 optimized for the next lowest temperature range, and so on until reaching memory array 410 which is optimized for the highest temperature range.

It should be noted that each of the memory arrays 402-410 are fabricated to allow an amount of overlap in the temperature range between itself and its neighbor. This depicted as the overlaps 450-456 in adjacent temperature ranges.

In one embodiment, where the system is currently at a low temperature and reading and writing are proceeding to a low temperature memory array (e.g., memory array 402), as the temperature begins to rise, eventually the system is going to have to transition to reading and writing to the next higher temperature memory array (e.g., memory array 404). Embodiments of the present invention include a process to automatically synchronize data between the memory arrays during a temperature change. An objective of the invention is to be able to operate across a comparatively broad range of temperatures. As depicted in FIG. 4, there is some overlap in the temperature ranges in at which neighboring memory arrays are functional. For example when temperature is rising, and is threatening to rise past the overlap area, the data from the low temperature memory array (e.g., memory array 402) is transferred to the next higher temperature memory array (e.g., memory array 404). This ensures data is not lost as temperature continues to rise. The same is true when the temperature is falling and thus a range transition occurs.

This process is referred to as synchronization between the low temperature memory array and the next higher temperature memory array or vice versa on a falling temperature, e.g., the process is reversed when temperature is declining. For example, when temperature dictates that reading and writing occur in a high temperature memory array (e.g., memory array 410), when the temperature begins to decline, and reaches the overlap area (e.g., overlap area 456), the data from the high temperature memory array is transferred to the next lower temperature memory array (e.g., synchronized). In one embodiment, ECC (error correction coding) helps with the synchronization both with increasing temperatures and decreasing temperatures.

In one embodiment, temperature optimized overlap synchronization is more critical when temperatures are rising. In one embodiment, at low temperatures it is typically too difficult and error prone to write to the higher temperature memory arrays. In one embodiment, attempting to do so leads to an unacceptable error rate.

It should be noted that during synchronization, the controller has to make decisions as to whether a complete copy of the data is synchronized from one memory array to the next. Depending upon different use case scenarios, in cases where the data that needs to be transferred is the code itself that runs the system, that data would need to be transferred in its entirety. Another use case scenario is a rolling log. This would be a case where after a certain amount of time the data that is logged is no longer useful to the system, and in this case there would be no need to transfer the stale data. For example, in a spaceflight use case scenario, space tourists go into space and they want to have streaming video and audio and they also want to capture their own video and audio of their journey. The resulting footage would be completely copied over during synchronization to ensure it is not lost to the tourists.

In one embodiment, the system is configured to perform extreme error recovery by reading the data from more than one array and voting on a valid data value (e.g., or apply some other ECC method).

In one embodiment, the system is configured for fast writing at high temperatures. For example, at high temperatures the low-temperature array is written to first (e.g., it writes faster). Then, based on time, and not temperature, the data is written from the low-temp array to higher and higher temp arrays until the correct temperature array is reached. The point of such a configuration is that lower delta MTJs write faster but they do not hold the data long enough.

Figure 5A:
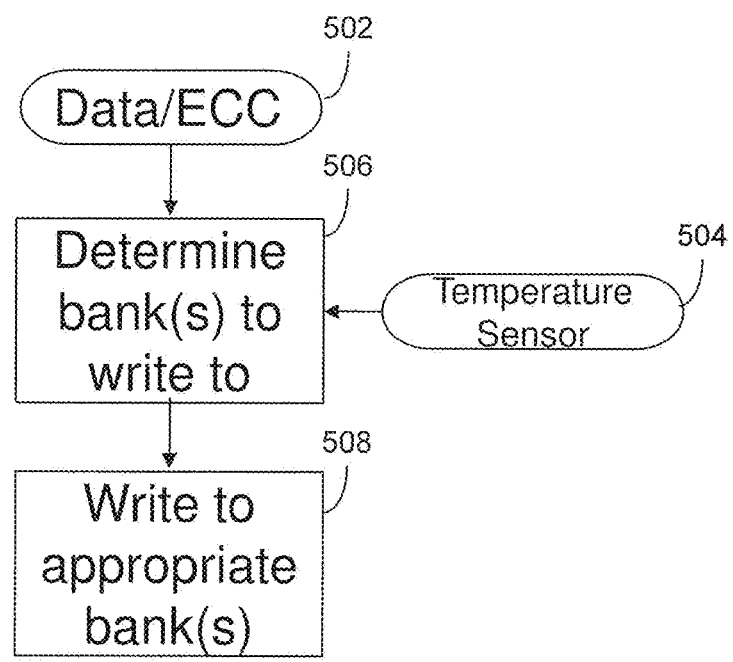
FIG. 5A shows a flowchart of the steps of an exemplary data writing process in accordance with one embodiment of the present invention.

FIG. 5A shows a flowchart of the steps of an exemplary data writing process 500 in accordance with one embodiment of the present invention. FIG. 5A begins in step 502, where data and error correction code are received by the system (e.g., by the buffer 306). In step 504, a temperature sensor provides temperature information to a controller (e.g., controller 314) of the current temperature of the memory system and this information is used to determine which bank (e.g., memory array) is to be used for writing the data. As described above this depends on what the current temperature is. And subsequently in step 508, the data is written to the appropriate bank.

Figure 5B:
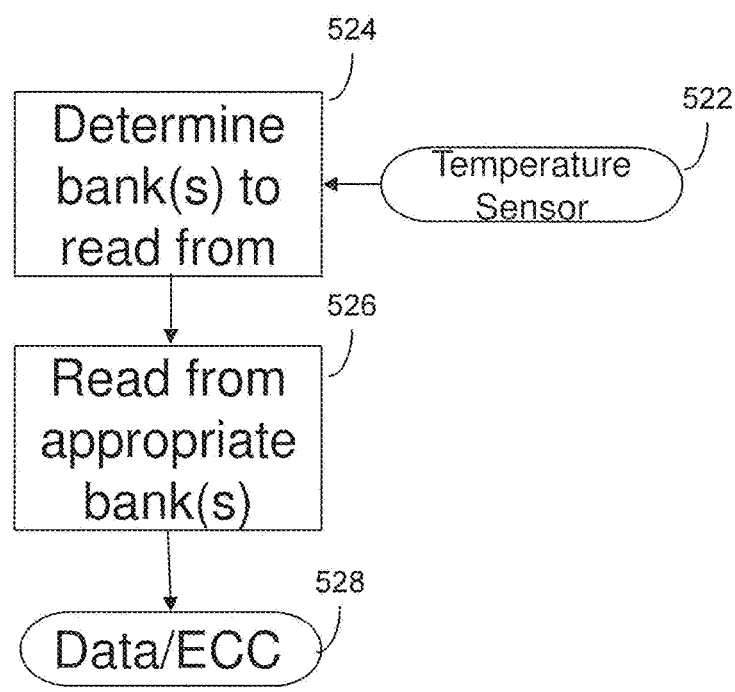
FIG. 5B shows a flowchart of the steps of a reading process in accordance with one embodiment of the present invention.

FIG. 5B shows a flowchart of the steps of a reading process 520 in accordance with one embodiment of the present invention. In step 524, a temperature sensor provides temperature information to a controller (e.g., controller 314) to determine which bank (e.g., memory array) is to be read from. As described above this depends on what the current temperature is. And in step 526, the data is read from the appropriate bank and into the buffer 306. Subsequently, in step 528, the data and error correction code is output through the port 308 (e.g., and goes to an ECC decoding engine).

Figure 6A:
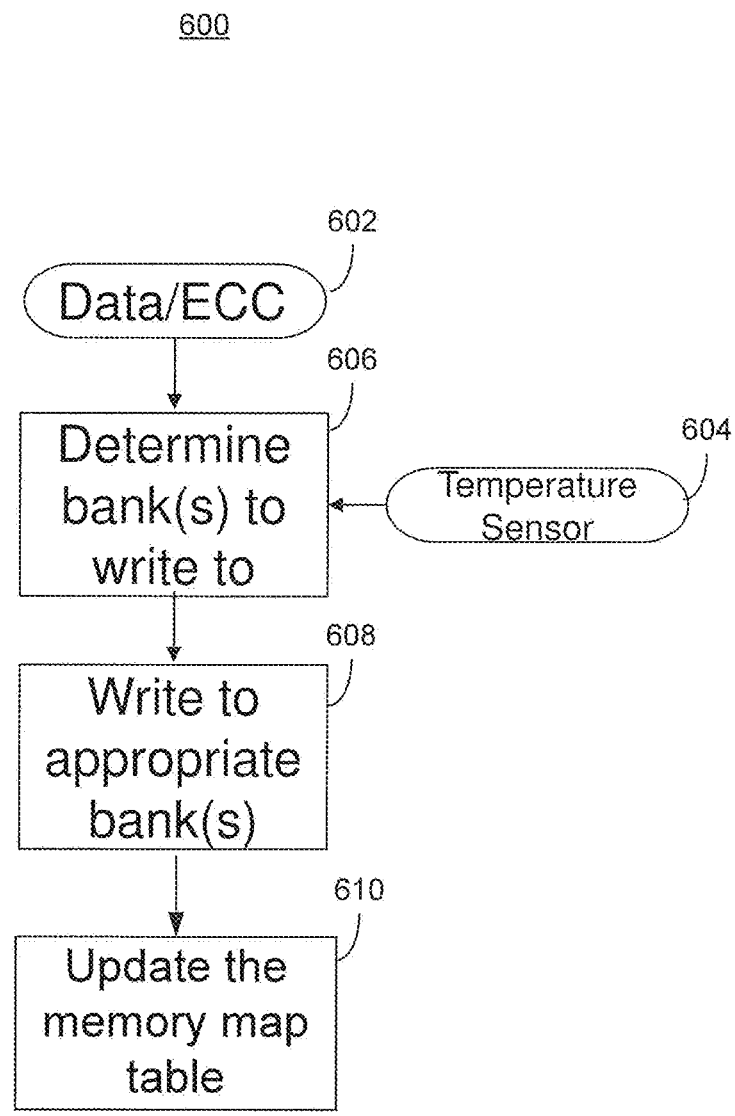
FIG. 6A shows a flowchart of the steps of an exemplary data writing process in accordance with one alternative embodiment of the present invention.

FIG. 6A shows a flowchart of the steps of an exemplary data writing process 600 in accordance with one alternative embodiment of the present invention. FIG. 6A begins in step 602, where data and error correction code are received by the system (e.g., by the buffer 306). In step 604, a temperature sensor provides temperature information to a controller (e.g., controller 314) of the current temperature of the memory system and this information is used to determine which bank (e.g., memory array) is to be used for writing the data. As described above this depends on what the current temperature is. And subsequently in step 608, the data is written to the appropriate bank. In step 610, the memory map table is updated to include the address and bank of the data write.

Figure 6B:
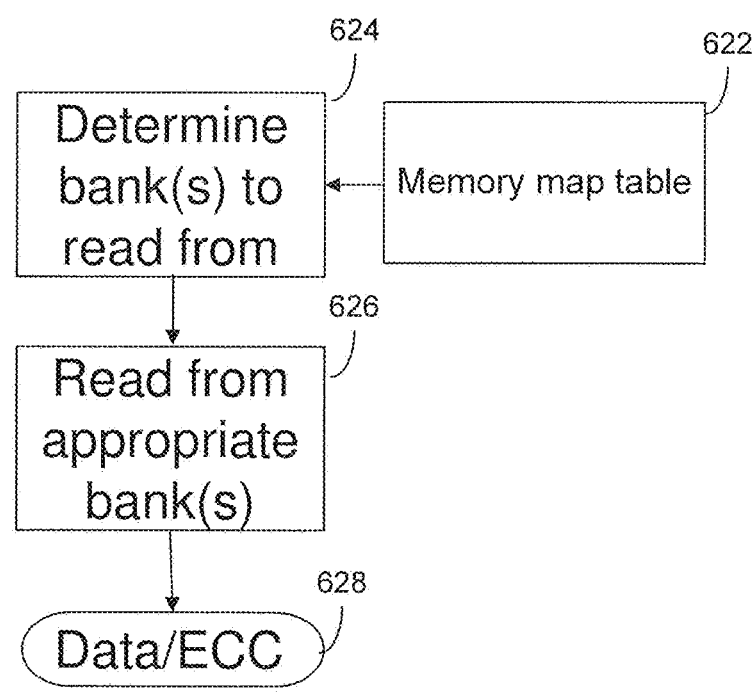
FIG. 6B shows a flowchart of the steps of a reading process in accordance with one alternative embodiment of the present invention.

FIG. 6B shows a flowchart of the steps of a reading process 620 in accordance with one alternative embodiment of the present invention. In step 624, a memory map table is accessed to obtain and provide addresses to a controller (e.g., controller 314) to determine the address and which bank (e.g., memory array) is to be read from. As described above this depends on what the current temperature is. And in step 626, the data is read from the appropriate bank and into the buffer 306. Subsequently, in step 628, the data and error correction code is output through the port 308.

Figure 7:
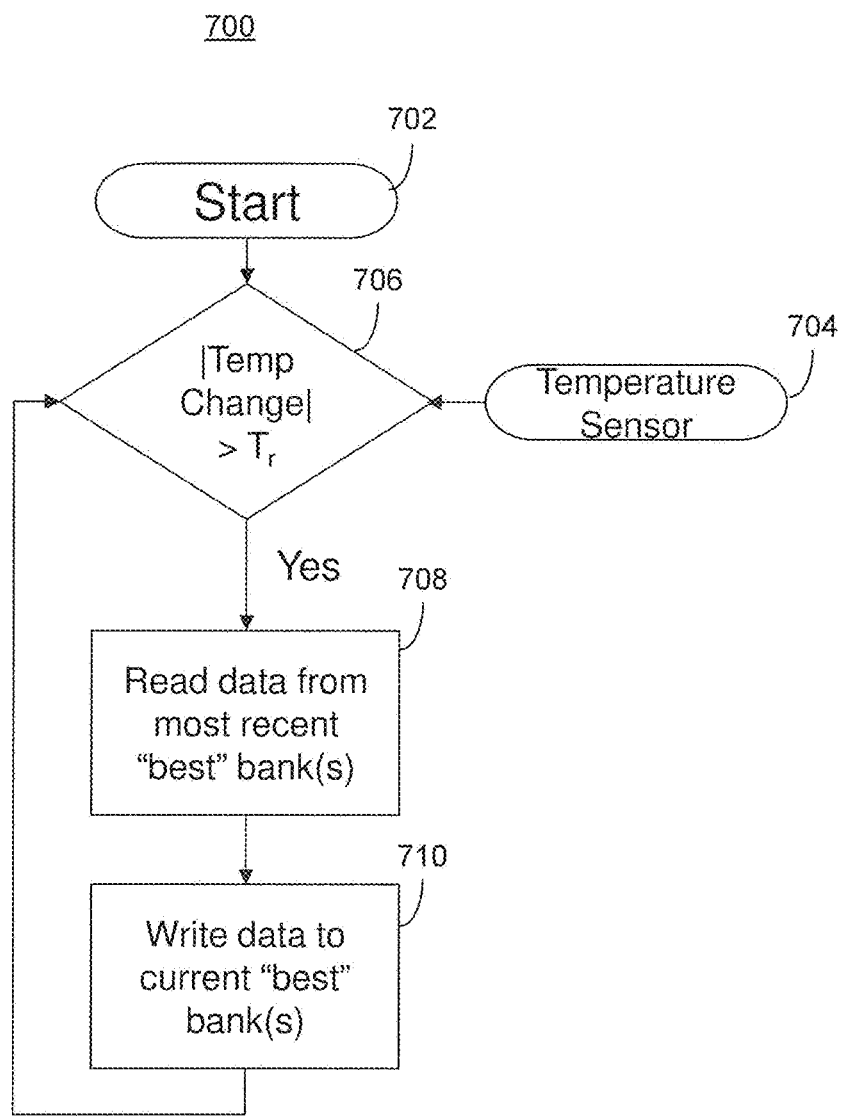
FIG. 7 shows a flowchart of the steps of a controlling process in accordance with one embodiment of the present invention.

FIG. 7 shows a flowchart of the steps of a controlling process 700 in accordance with one embodiment of the present invention. FIG. 7 shows the exemplary steps of a state machine executed by a controller (e.g., controller 314). Process 700 starts at step 702 when a state machine commences operation. In step 704, a temperature sensor provides temperature information to a controller. In step 706 the controller compares the temperature information against previously received temperature information to determine whether there is a change in temperature. If there is no change in temperature, process 700 remains in step 706. If there is a change in temperature, process 700 proceeds to step 708 were it reads data from the most recent selected bank (e.g., memory array). This selected memory array is typically the last memory array which was read or written to at the previous temperature. In step 710, data is written to the newly selected best memory array based upon the new temperature. Subsequently process 700 proceeds back to step 706 where temperature readings are again monitored from the temperature sensor.

Figure 8:
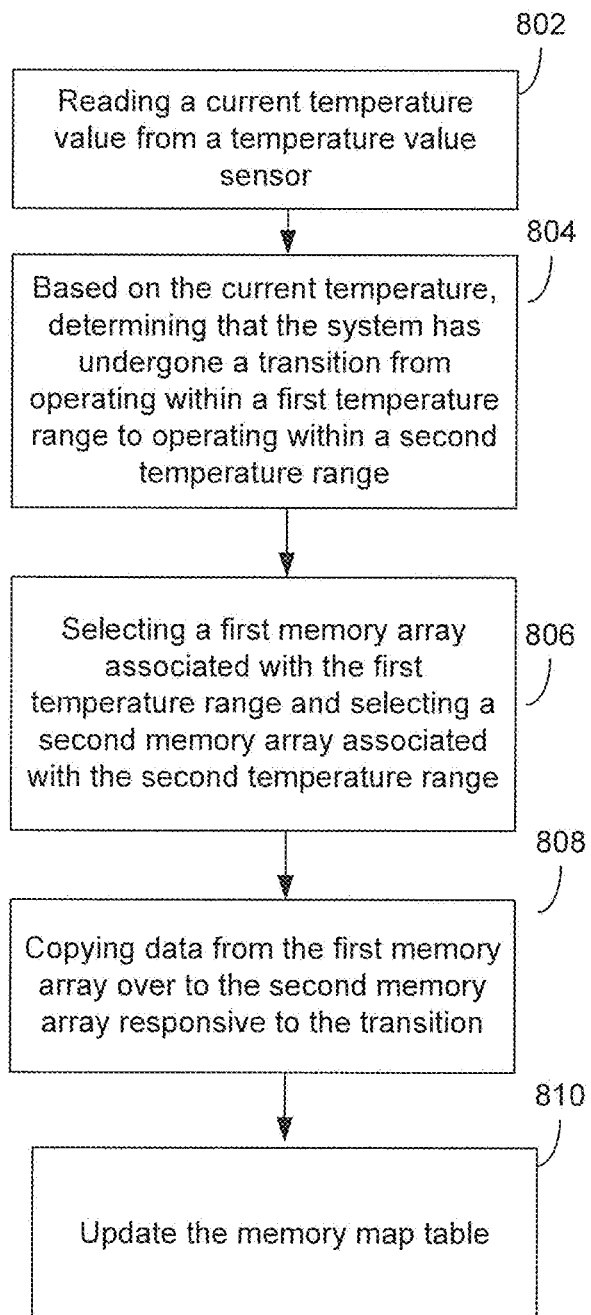
FIG. 8 shows a flowchart of the steps of a copy over process in accordance with one embodiment of the present invention responsive to a detected temperature change of the memory system.

FIG. 8 shows a flowchart of the steps of a copy over process 800 in accordance with one embodiment of the present invention. Process 800 begins in step 802, where a current temperature value is read from a temperature sensor. In step 804, based on the current temperature, process 800 determines whether the system has undergone a transition from operating within a first temperature range (e.g., low temperature) to operating within a second temperature range (e.g., medium temperature). In step 806, a first memory array associated with the first temperature range is selected. A second memory array associated with a second temperature range is also selected. In step 808, data from the first memory array is copied over to the second memory array in response to the transition. In step 810, the memory map table is updated in accordance with the copy over.

In this manner, embodiments of the present invention implement a system for a temperature robust nonvolatile memory for operation across broad temperature ranges. Embodiments of the present invention implement a temperature robust MRAM data storage system that does not add excessive mass to the vehicle. Embodiments of the present invention provides a reliable MRAM system that can function reliably across a broad temperature range.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A system comprising:
    a memory organized into an addressable memory range and comprising a plurality of memory arrays comprising memory cells wherein each memory array is configured for operation over a different temperature range;
    a buffer for receiving a data word and an associated address for writing into said memory;
    a temperature sensor for sensing a current temperature of operation of said memory;
    a write controller coupled to said buffer, said temperature sensor and said memory, said write controller operable to perform a write operation comprising:
        accessing a temperature value from said temperature sensor;
        selecting a selected memory array of said plurality of memory arrays that is configured for operation at said temperature value; and
        writing said data word, at said associated address, to said selected memory array; and
    a memory table associated with said memory, wherein said memory table is operable to store an address map for indicating which memory array of said plurality of memory arrays comprises a data word associated with a given address within said addressable memory range.

2. A system as described in claim 1 wherein said memory cells of said plurality of memory arrays comprise magnetic memory cells.

3. A system as described in claim 2 wherein said magnetic memory cells comprise Magnetic Tunnel Junction type magnetic memory cells.

4. A system as described in claim 1 further comprising a read controller coupled to said buffer, said temperature sensor and said memory, said read controller operable to perform a read operation comprising:
    accessing a read address from said buffer wherein said read address is associated with said read operation;
    reading contents of said memory table associated with said read address to determine a particular memory array of said plurality of memory arrays containing data associated with said read address; and
    reading said particular memory array, at said read address, to obtain a data word associated with said read address.

5. A system as described in claim 1 wherein said plurality of memory arrays comprises:
    a first memory array comprising a plurality of first memory cells that are fabricated to operate over a first temperature range;
    a second memory array comprising a plurality of second memory cells that are fabricated to operate over a second temperature range, wherein said second temperature range is higher than said first temperature range; and
    a third memory array comprising a plurality of third memory cells that are fabricated to operate over a third temperature range, wherein said third temperature range is higher than said second temperature range and wherein said second temperature range is higher than said first temperature range and wherein further a high temperature of said first temperature range and a low temperature of said second temperature range overlap and wherein further a high temperature of said second temperature range and a low temperature of said third temperature range overlap.

6. A system as described in claim 1 further comprising a management controller coupled to said memory and said temperature sensor, said management controller for performing a copy-over procedure comprising:
    reading a current temperature value from said temperature sensor;
    based on said current temperature value, determining that said memory has undergone a transition from operating within a first temperature range to operating within a second temperature range;
    selecting a first memory array associated with said first temperature range and selecting a second memory array associated with said second temperature range; and
    copying data from said first memory array over to said second memory array responsive to said transition.

7. A system as described in claim 1 further comprising a management controller coupled to said memory and said temperature sensor, said management controller for performing a copy-over procedure comprising:
  reading a current temperature value from said temperature sensor;
  based on said current temperature value, determining that said memory has undergone a transition from operating within a first temperature range to operating within a second temperature range;
  selecting a first memory array associated with said first temperature range and selecting a second memory array associated with said second temperature range;
  copying data from said first memory array over to said second memory array responsive to said transition; and
  updating said address map of said memory table to indicate that said data copied from said copying is addressable using said second memory array.

8. A method of writing data to a memory system, said method comprising:
  receiving a data word and an associated address for writing into said memory system, wherein said memory system is organized into an addressable memory range and comprises a plurality of memory arrays comprising memory cells wherein each memory array of said plurality of memory arrays is configured for operation over a different temperature range;
  accessing a current temperature value from a temperature sensor;
  selecting a selected memory array of said plurality of memory arrays that is configured for operation at said current temperature value;
  writing said data word, at said associated address, to said selected memory array;
  maintaining an address map within a memory table wherein said address map indicates which memory array of said plurality of memory arrays comprises a data word associated with a given address of said addressable memory range; and
  responsive to said writing, updating said address map to indicate that said associated address is associated with said selected memory array.

9. A method as described in claim 8 wherein said memory cells of said plurality of memory arrays comprise magnetic memory cells.

10. A system as described in claim 9 wherein said magnetic memory cells comprise Magnetic Tunnel Junction type magnetic memory cells.

11. A method as described in claim 8 further comprising performing a read operation, said read operation comprising:
  accessing a read address associated with said read operation;
  reading contents of said memory table associated with said read address to determine a particular memory array of said plurality of memory arrays containing data associated with said read address; and
  reading said particular memory array, at said read address, to obtain a data word associated with said read address.

12. A method as described in claim 8 wherein said plurality of memory arrays comprises:
  a first memory array comprising a plurality of first memory cells that are fabricated to operate over a first temperature range;
  a second memory array comprising a plurality of second memory cells that are fabricated to operate over a second temperature range, wherein said second temperature range is higher than said first temperature range; and
  a third memory array comprising a plurality of third memory cells that are fabricated to operate over a third temperature range, wherein said third temperature range is higher than said second temperature range and wherein said second temperature range is higher than said first temperature range and wherein further a high temperature of said first temperature range and a low temperature of said second temperature range overlap and wherein further a high temperature of said second temperature range and a low temperature of said third temperature range overlap.

13. A method as described in claim 8 further comprising performing a copy-over procedure comprising:
  reading a current temperature value from said temperature sensor;
  based on said current temperature, determining that said memory has undergone a transition from operating within a first temperature range to operating within a second temperature range;
  selecting a first memory array associated with said first temperature range and selecting a second memory array associated with said second temperature range; and
  copying data from said first memory array over to said second memory array responsive to said transition.

14. A method as described in claim 8 further comprising performing a copy-over procedure comprising:
  reading a current temperature value from said temperature sensor;
  based on said current temperature, determining that said memory has undergone a transition from operating within a first temperature range to operating within a second temperature range;
  selecting a first memory array associated with said first temperature range and selecting a second memory array associated with said second temperature range;
  copying data from said first memory array over to said second memory array responsive to said transition; and
  updating said address map to indicate that data copied from said copying is addressable by said second memory array.

15. A method of storing data in a memory system, said method comprising:
  maintaining an address map of data stored in a memory system, wherein said memory system is organized into an addressable memory range and comprising a plurality of memory arrays comprising memory cells wherein each memory array of said plurality of memory arrays is configured for operation over a different temperature range and wherein further said memory system is configured to operate over a plurality of temperature ranges, and wherein said address map indicates which memory array of said plurality of memory arrays comprises a data word associated with a given address;
  reading a current temperature value from a temperature sensor;
  based on said current temperature value, determining that said memory system has undergone a transition from operating within a first temperature range of said plurality of temperature ranges to operating within a second temperature range of said plurality of temperature ranges;
  selecting a first memory array associated with said first temperature range and selecting a second memory array associated with said second temperature range;
  copying data from said first memory array over to said second memory array responsive to said transition; and updating said memory map based on said copying.

16. A method as described in claim 15 wherein said memory cells of said plurality of memory arrays comprise magnetic memory cells.

17. A system as described in claim 16 wherein said magnetic memory cells comprise Magnetic Tunnel Junction type magnetic memory cells.

18. A method as described in claim 15 further comprising performing a read operation, said read operation comprising:
   accessing a read address associated with said read operation;
   reading contents of said address map associated with said read address to determine a particular memory array of said plurality of memory arrays containing data associated with said read address; and
   reading said particular memory array, at said read address, to obtain a data word associated with said read address.

19. A method as described in claim 15 wherein said plurality of memory arrays comprises:
   a first memory array comprising a plurality of first memory cells that are fabricated to operate over a first temperature range;
   a second memory array comprising a plurality of second memory cells that are fabricated to operate over a second temperature range, wherein said second temperature range is higher than said first temperature range; and
   a third memory array comprising a plurality of third memory cells that are fabricated to operate over a third temperature range, wherein said third temperature range is higher than said second temperature range and wherein said second temperature range is higher than said first temperature range and wherein further a high temperature of said first temperature range and a low temperature of said second temperature range overlap and wherein further a high temperature of said second temperature range and a low temperature of said third temperature range overlap.

20. A method as described in claim 15 further comprising performing a write operation, said write operation comprising:
   accessing said temperature sensor to obtain a current temperature value;
   receiving a data word and an associated address for writing into said memory system;
   selecting a selected memory array of said plurality of memory arrays that is configured for operation at said current temperature value;
   writing said data word, at said associated address, to said selected memory array; and
   updating said address map responsive to said writing.

21. A method as described in claim 15, further comprising performing extreme error recovery by reading the data from a plurality of memory arrays and voting on a valid data value.

22. A method as described in claim 15, further comprising performing extreme error recovery by reading the data from a plurality of memory arrays and applying error correction coding to obtain a valid data.

23. A method as described in claim 15, further comprising, writing to the low-temperature array is written to first at high temperature, and based on a time value, writing from the low-temp array to a higher temperature array until a correct temperature array is reached.

* * * * *